(12) United States Patent
Mactaggart

(10) Patent No.: US 9,240,848 B2
(45) Date of Patent: Jan. 19, 2016

(54) EYE QUALITY MONITORING SYSTEM AND METHOD

(71) Applicant: Tyco Electronics Corporation, Berwyn, PA (US)

(72) Inventor: Iain Ross Mactaggart, Eden Prairie, MN (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 14/299,037

(22) Filed: Jun. 9, 2014

(65) Prior Publication Data

US 2015/0358090 A1 Dec. 10, 2015

(51) Int. Cl.
*H04B 3/46* (2015.01)
*H04B 17/00* (2015.01)
*H04Q 1/20* (2006.01)

(52) U.S. Cl.
CPC ...................................... *H04B 17/00* (2013.01)

(58) Field of Classification Search
CPC ...................................................... H04B 17/00
See application file for complete search history.

(56) References Cited

U.S. PATENT DOCUMENTS 6,433,899 B1    8/2002   Anslow
6,762,626 B1*   7/2004   Dreps et al. ...................... 327/2
2004/0017870 A1   1/2004   Dietrich
2005/0030001 A1*  2/2005   Jasa et al. .................... 324/76.53
2005/0046490 A1*  3/2005   Jasa et al. ........................ 331/25
2008/0152057 A1   6/2008   Lee et al.
2013/0294492 A1* 11/2013   Miao ............................. 375/232

OTHER PUBLICATIONS

International Search Report and Written Opinion mailed Sep. 9, 2015 in PCT application PCT/US2015/034755 (counterpart of U.S. Appl. No. 14/299,037).
Ellermeyer T. et al., "A 10-Gb/s Eye-Opening Monitor IC for Decision-Guided Adaptation of the Frequency Response of an Optical Receiver", IEE Journal of Solid-State Circuits, IEEE Service Center, Piscataway, NJ, USA, vol. 35, No. 12, Dec. 1, 2000, pp. 1958-1963.

* cited by examiner

*Primary Examiner* — Erin File

(57) ABSTRACT

An eye quality monitoring system may include an eye quality monitor that includes a charge pump that is configured to output (a) a first charge in a first direction upon detection of a first transition of a sampled non-return-to-zero (NRZ) data signal in a first region of a unit interval of an eye pattern, and (b) a second charge in a second direction upon detection of a second transition of the sampled NRZ data signal in a second region of the unit interval of the eye pattern. The first direction is opposite from the second direction. The eye quality monitor is configured to form an eye quality output that relates to a quality of the eye pattern based on the first and second charges.

20 Claims, 4 Drawing Sheets

EYE QUALITY MONITORING SYSTEM AND METHOD

BACKGROUND OF THE DISCLOSURE

Embodiments of the present disclosure generally relate to a system and method for monitoring eye quality of data.

Non-return-to-zero (NRZ) is a form of digital data transmission in which binary low and high states are transmitted by specific and constant direct current voltages. In positive-logic NRZ, the low state may be represented by the more negative or less positive voltage, and the high state may be represented by the less negative or more positive voltage. For example, a logic state of 0 may be represented by 0.5 volts, while the logic state of 1 may be represented by represented by 1 volt. Conversely, in negative-logic NRZ, the low state may be represented by the more positive or less negative voltage, while the high state may be represented by the less positive or more negative voltage. For example, a logic state of 0 may be represented by 1 volt, while the logic state of 1 may be represented by 0.5 volts. In general, NRZ data includes binary code in which 1s are represented by one significant condition (such as a positive voltage) and 0s are represented by another significant condition (usually a negative voltage), with no other neutral or rest condition.

NRZ data may be displayed with respect to an eye diagram or pattern. In an eye diagram, a data signal from a receiver is repetitively sampled and applied to a vertical input, while the data rate is used to trigger a horizontal sweep. The display is referred to as an eye diagram because the pattern appears as a series of eyes between a pair of rails.

An eye diagram provides an indication of the quality of signals in high-speed digital transmissions, for example. An oscilloscope, for example, may generate an eye diagram by overlaying sweeps of different segments of a long data stream driven by a master clock. When many such transitions have been overlaid, positive and negative pulses are superimposed on each other. When many bits are overlaid, the resulting image appears similar to the opening of an eye.

Eye quality refers to the openness of an eye diagram. A perfect eye diagram is generally open such that all data transitions take place at the same multiples of a unit interval. However, when data transitions occur at different multiples of the unit interval, the quality of the eye diagram diminishes, such that the eye diagram begins to close. While a perfect eye diagram is open, a poor eye diagram exhibits smearing, fuzziness, or other distortions that encroach into (or close) the eye pattern.

Accordingly, assessing the quality of an eye diagram provides information as to the quality of data received by a system. However, known eye quality monitoring devices typically include complex circuits that utilize relatively high levels of power during operation.

BRIEF DESCRIPTION OF THE DISCLOSURE

Certain embodiments of the present disclosure provide an eye quality monitoring system that may include an eye quality monitor that includes a charge pump that is configured to output (a) a first charge in a first direction upon detection of a first transition of a sampled non-return-to-zero (NRZ) data signal in a first region of a unit interval of an eye pattern, and (b) a second charge in a second direction upon detection of a second transition of the sampled NRZ data signal in a second region of the unit interval of the eye pattern. The first direction may be opposite from the second direction. The eye quality monitor is configured to form an eye quality output that relates to a quality of the eye pattern based on the first and second charges.

The eye quality monitor may also include an averaging circuit in communication (such as being electrically connected) with the charge pump. The averaging circuit is configured to receive the first and second charges from the charge pump and aggregate or average the first and second charges to form the eye quality output. The averaging circuit may include an integrating capacitor that is configured to receive the first and second charges over a time period and aggregate or average the first and second charges to form a total net charge. The averaging circuit may include one or more resistors configured to convert the first and second charges to one or more voltages indicative of the eye quality output.

The system may also include a receiver configured to receive an NRZ data signal, and a phase detector configured to convert the NRZ data signal into the sampled NRZ data signal. In at least one embodiment, the system may also include an eye diagram module configured to form the eye pattern based on the sampled NRZ signal.

The first region may be within a middle region or within leading and trailing end regions of the unit interval. The second region may be within the other of the middle region or the leading and trailing end regions of the unit interval. In at least one embodiment, the leading end region is the first quarter of the unit interval, the middle region is the second and third quarters of the unit interval, and the trailing end is the fourth quarter of the unit interval.

Certain embodiments of the present disclosure provide an eye quality monitoring method that may include detecting a first transition of a sampled non-return-to-zero (NRZ) data signal in a first region of a unit interval of an eye pattern, outputting a first charge in a first direction from a charge pump upon the detecting of the first transition of the sampled NRZ data signal in the first region, detecting a second transition of the sampled NRZ data signal in a second region of the unit interval, outputting a second charge in a second direction upon the detecting of the second transition of the sampled NRZ data signal in the second region, wherein the first direction is opposite from the second direction, and forming an eye quality output (that relates to a quality of the eye pattern) based on the first and second charges.

The method may also include aggregating or averaging the first and second charges to form the eye quality output. The aggregating or averaging may include forming a total net charge based on the first and second charges. In at least one embodiment, the method may also include converting the first and second charges to one or more voltages indicative of the eye quality output.

DETAILED DESCRIPTION OF THE DISCLOSURE

Figure 1:
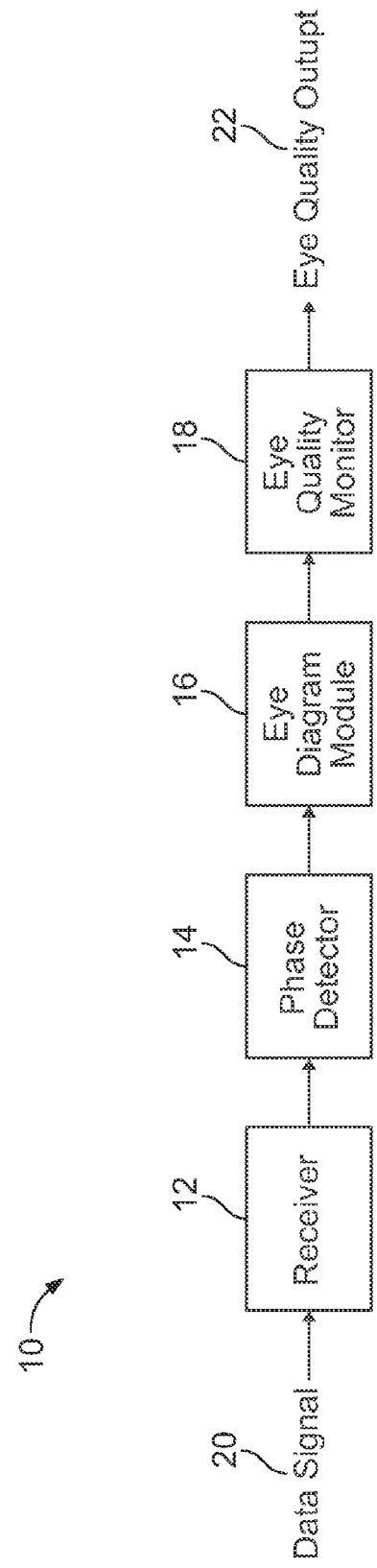
FIG. 1 illustrates a schematic block diagram of an eye quality monitoring system, according to an embodiment of the present disclosure.

FIG. 1 illustrates a schematic block diagram of an eye quality monitoring system 10, according to an embodiment of the present disclosure. The eye quality monitoring system 10 may include a receiver 12 in communication (such as being electrically connected through a wired or wireless connection) with a phase detector 14, which is, in turn, in communication with an eye diagram module 16, which is, in turn, in communication with an eye quality monitor 18. In at least one embodiment, the receiver 12 may include the phase detector 14, for example, or the phase detector 14 may include the receiver 12. Optionally, the receiver 12 and the phase detector 14 may be separate and distinct components. Also, the phase detector 14 and the eye diagram module 16 may be part of the same circuit, for example. Further, the receiver 12, the phase detector 14, the eye diagram module 16, and the eye quality monitor 18 may be part of a single integrated circuit, chip, module, printed circuit board, and/or the like.

The receiver 12 is configured to receive a data signal 20, such as an NRZ data signal. The data signal 20 is received by the receiver 12, which may include a clock-and-data-recovery (CDR) circuit that may be locked to the incoming data signal 20. The phase detector 14 receives the data signal 20 and samples the NRZ data signal over time to determine phase transitions between logic states, for example. The phase detector 14 may include a frequency mixer, an analog multiplier or a logic circuit that generates a voltage signal that represents the difference in phase between two signal inputs. The phase detector 14 may include a local oscillator and may output a sampled data signal that may include data regarding the relative phase and time position of a local oscillator within the phase detector 14 with respect to the data signal 20, such as NRZ data. The phase detector 14 outputs the sampled data signal to the eye diagram module 16, which may generate an eye diagram of the data signal 20 based on the sampled data signal. The eye quality monitor 18 analyzes the eye diagram and outputs an eye quality output 22 based on the analysis of the eye diagram and/or the sampled data signal from the phase detector 14. Alternatively, the eye quality monitoring system 10 may not include the separate and distinct eye diagram module 16. Instead, the eye quality monitor 18 may determine the eye quality based on the sampled data signal received from the phase detector 14.

The eye quality monitoring system 10 provides a low power (for example, 1 mA or less) system and method for deriving an eye quality measurement of the data signal 20, such as a high speed NRZ data stream. As explained below, the eye quality monitoring system 10 may output the eye quality output 22 based on an analysis of transitions within particular areas of an eye diagram or pattern.

Figure 2:
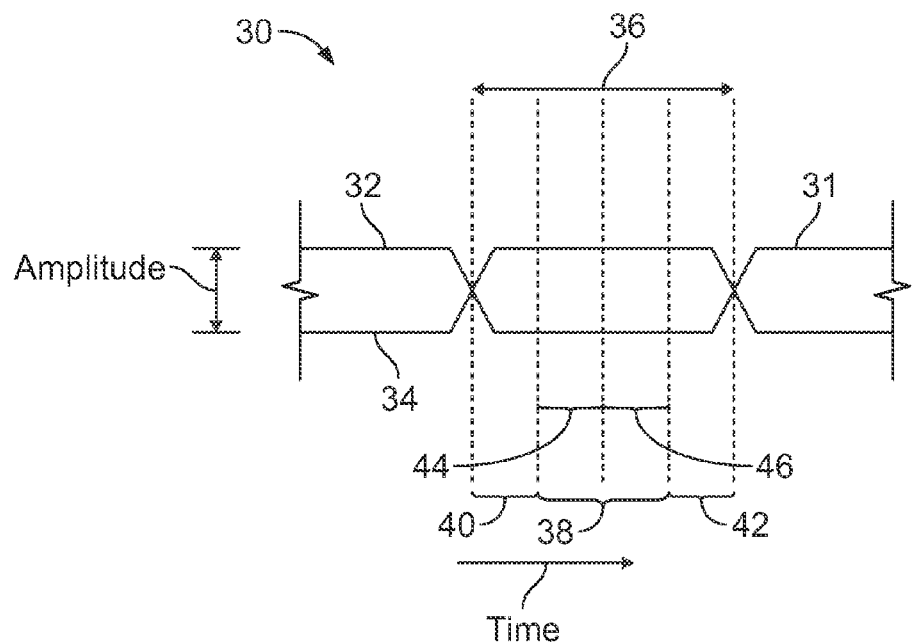
FIG. 2 illustrates an eye diagram of an NRZ signal, according to an embodiment of the present disclosure.

FIG. 2 illustrates an eye diagram 30 of an NRZ signal 31, according to an embodiment of the present disclosure. As noted above, the NRZ signal 31 may be the data signal 20, shown in FIG. 1, and/or a sampled NRS signal. For example, the phase detector 14 may sample the data signal to produce the sampled data signal, in the form of the NRZ signal 31. Referring to FIGS. 1 and 2, the eye diagram 30 may be formed by the eye diagram module 16 through an analysis of the sampled data signal by the phase detector 14. Optionally, the phase detector 14 may form the eye diagram 30.

Referring to FIG. 2, in particular, the eye diagram 30 may include first and second logic levels 32 and 34. For example, the first logic level 32 may be 1, while the second logic level 34 may be 0. Alternatively, the first logic level 32 may be +1, while the second logic level 34 may be −1. The difference between the first and second logic levels 32 and 34 represents an amplitude of the NRZ signal 31.

A single unit interval 36 of the NRZ signal 31 may include a middle region 38 and edge regions 40 and 42. The middle region 38 may be split into middle halves 44 and 46. Accordingly, the unit interval 36 may include four regions 40, 44, 46, and 42, each of equal duration. For example, the unit interval 36 may last a total of forty picoseconds (ps), with the leading edge region 40 being the first 10 ps, the middle half 44 being the second 10 ps, the middle half 46 being the third 10 ps, and the trailing edge region 42 being the fourth 10 ps. It is to be understood, however, the unit interval 36 may be shorter or longer than 40 ps. Further, while the unit interval 36 is shown split evenly among four separate regions 40, 44, 46, and 42, the unit interval 36 may be split among more or less regions. For example, the unit interval 36 may include a leading edge region, a middle region, and a trailing edge region, with the leading edge region lasting the first ⅓ of the unit interval 36, the middle region lasting the second ⅓ of the unit interval 36, and the trailing edge region lasting the final ⅓ of the unit interval.

As shown in FIG. 2, the eye diagram 30 shows a perfect eye pattern in which NRZ data transitions occur in the edge regions 40 and 42, as opposed to the middle region 38. Accordingly, a high quality eye diagram 30 includes data transitions at the edge regions 40 and 42. When data transitions occur within the middle region 38, the quality of the eye diagram 30 diminishes. As such, the quality of the eye diagram 30 decreases as the number of data transitions within the middle region 38 increases.

Referring again to FIGS. 1 and 2, an NRZ data transition occurs either in the edge regions 40 and 42 or the middle region 38. As noted, transitions within the middle region 38 diminish the quality of the eye diagram 30. The eye quality monitor 18 analyzes the NRZ signal 31 and/or the eye diagram 30 to determine the quality of the eye pattern or diagram 30. The eye quality monitor 18 detects transitions within the unit interval 36 and provides the eye quality output 22 based on the detected transitions. For example, when the eye quality monitor 18 detects a transition within the edge regions 40 and 42, the eye quality monitor 18 may pump current or charge in a first direction, such as up or down. In at least one embodiment, when the eye quality monitor 18 detects a transition in the middle region 38, the eye quality monitor 18 may pump charge or current in a first direction, and when the eye quality monitor 18 detects a transition in the edge regions 40 and 42, the eye quality monitor 18 may pump charge or current in a second direction that is opposite from the first. The eye quality monitor 18 may aggregate the total net current over a predetermined time (such as one or more unit intervals) and output the eye quality output 22 based thereon.

Figure 3:
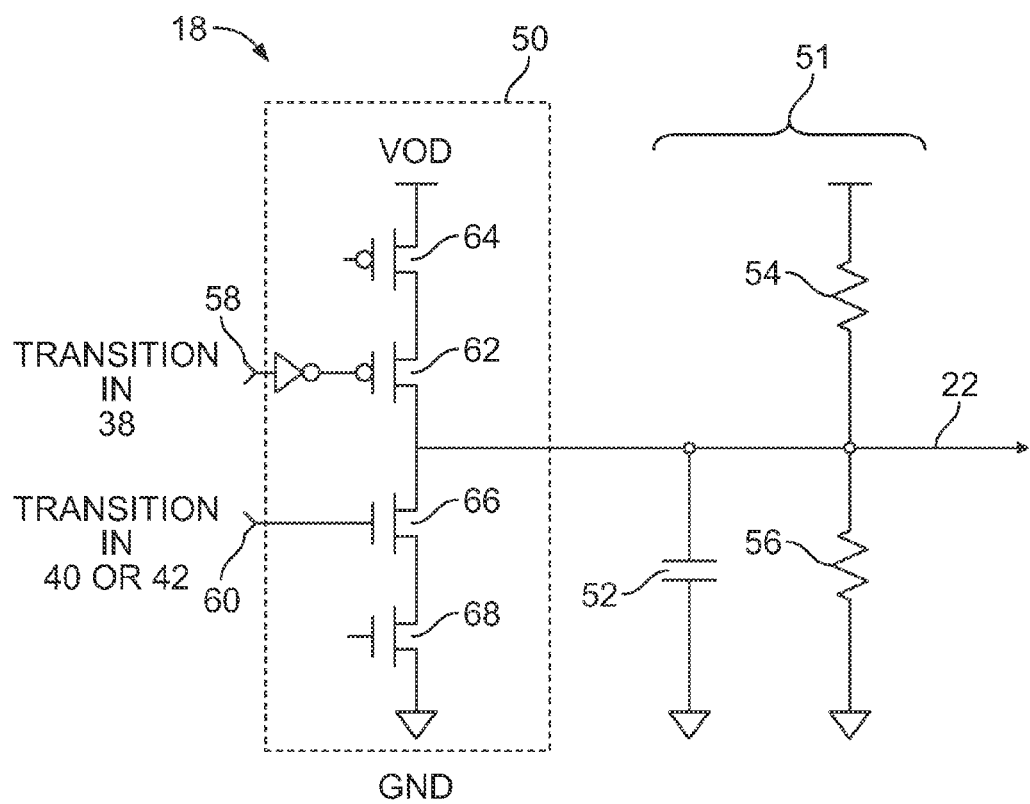
FIG. 3 illustrates a circuit diagram of an eye quality monitor, according to an embodiment of the present disclosure.

FIG. 3 illustrates a circuit diagram of the eye quality monitor 18, according to an embodiment of the present disclosure. The eye quality monitor 18 may include a charge pump 50 operatively connected to an averaging circuit 51, which may include an integrating capacitor 52, and resistors 54 and 56. The charge pump 50 may be a current source that either pumps current or charge up toward an elevated level or down toward ground. The charge pump 50 may include first and second transition input lines 58 and 60. The first transition input line 58 includes a signal input representing a transition in the middle region 38, shown in FIG. 2. The second transition input line 60 includes a signal input representing a transition in the edge regions 40 or 42.

The first transition input line 58 includes a switching transistor 62 and a current source transistor 64. Similarly, the second transition input line 60 includes a switching transistor 66 and a current source transistor 68. As such, the charge pump 50 is configured to provide charge in two directions. When a transition of the sampled data signal (such as a sampled NRZ data signal) occurs in the middle region 38, the switching transistor 62 closes (and the switching transistor 66 opens) so that the sampled data signal travels through the first transition input line 58 and causes the current source transistor 64 to output a first current, such as a positive charge. Conversely, when a transition of the sampled data signal occurs in the edge regions 40 or 42, the switching transistor 66 closes (and the switching transistor 62 opens) so that the signal input travels through the second transition input line 60 and causes the current source transistor 68 to output a second current, such as a neutral or negative charge. Thus, when transitions occur in the middle region 38, the charge pump outputs a first charge, and when transitions occur in the edge regions 40 or 42, the charge pump outputs a second charge, such as a ground charge or other charge that is opposite from the first charge. The first and second charges may be in opposite directions.

In at least one embodiment, the current or charge output by the current source transistor 64 may be an order of magnitude greater than the current or charge output by the current source transistor 68, or vice versa. For example, the current or charge output by the current source transistor 64 may be 10 times the current or output by the current source transistor 68 in the opposite direction. Alternatively, the current or charge output by the current source transistors 64 and 68 may be equal, but opposite. Also, alternatively, the current or charge output by the current source transistor may be more or less than 10 times the current or charge output by the current source transistor 68. The increased magnitude of charge or current output by the current source transistor 64 provides greater clarity with respect to undesired transitions in the middle region 38, as even poor quality eye diagrams may include a majority of transitions in the edge regions 40 or 42. The weighted, increased magnitude of the charge output by the current source transistor 64 allows for quicker detection of a degrading eye pattern.

As shown and described, the current source transistor 64 may be configured to output a charge in a positive direction, while the current source transistor 68 may be configured to output a charge in a negative direction. Alternatively, the current source transistor 64 may be configured to output a charge in a negative direction, while the current source transistor 68 is configured to output charge in a positive direction.

The integrating capacitor 52 and the resistors 54 and 56 are configured to provide a smooth continuous representation of eye quality. For example, the charge pump 50 outputs a charge signal as described above. The integrating capacitor 52 receives the charge signal from the charge signal over time and aggregates or averages the total charge signal. For example, for each positive charge pump received, the charge capacitor 52 adds to the total charge signal, while for each negative charge signal received, the charge capacitor 52 subtracts from the total charge signal. The charge capacitor 52 provides a net charge signal over a predetermined time, such as the period of one or more unit intervals, and outputs the net charge signal to the resistors 54 and 56, which convert the net charge signal to a voltage.

Accordingly, a high quality eye diagram having little or no transitions in the middle region 38 may produce an eye quality output 22 having a low voltage. Conversely, a low quality eye diagram having numerous transitions in the middle region 38 may produce an eye quality output 22 having an elevated voltage (in relation to the low voltage). As such, the voltage level of the eye quality output 22 may be analyzed to determine the quality of the eye diagram, such that eye quality decreases with increasing voltage, and eye quality increases with decreasing voltage. Alternatively, the system may be configured such that a high quality eye diagram results in the eye quality output 22 having an elevated voltage, while a low quality eye diagram results in the eye quality output 22 having a lower voltage than the elevated voltage.

Alternatively, the eye quality monitor 18 may not include the averaging circuit 51. Instead, the eye quality monitor 18 may include the charge pump 50 and the eye quality output 22 may be analyzed with respect to the output charge signals from the charge pump 50. For example, the eye quality may be determined based on the number of charge signals received from the current source transistor 64 over a predetermined period of time, such as one or more unit intervals.

Figure 4:
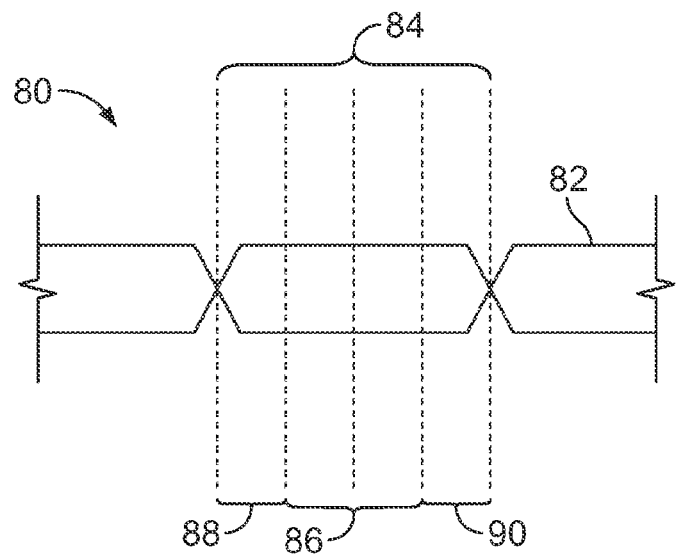
FIG. 4 illustrates an eye diagram of an NRZ signal, according to an embodiment of the present disclosure.

FIG. 4 illustrates an eye diagram 80 of an NRZ signal 82, according to an embodiment of the present disclosure. A single unit interval 84 of the NRZ signal 82 may include a middle region 86 and edge regions 88 and 90. As shown, the single unit interval 84 may be evenly divided into three regions of equal duration, such that the region 88 occurs over a first duration the length of which equals the duration of each of the regions 86 and 90. The eye quality monitor 18 described above may output the eye quality output 22 based on analysis of transitions within the three regions 86, 88, and 90. For example, when a transition occurs in the regions 88 and 90, the eye quality monitor 18 may output a charge signal in a first direction. Conversely, when a transition occurs in the region 86, the eye quality monitor 18 may output a charge signal in a second direction that is opposite from the first direction.

Figure 5:
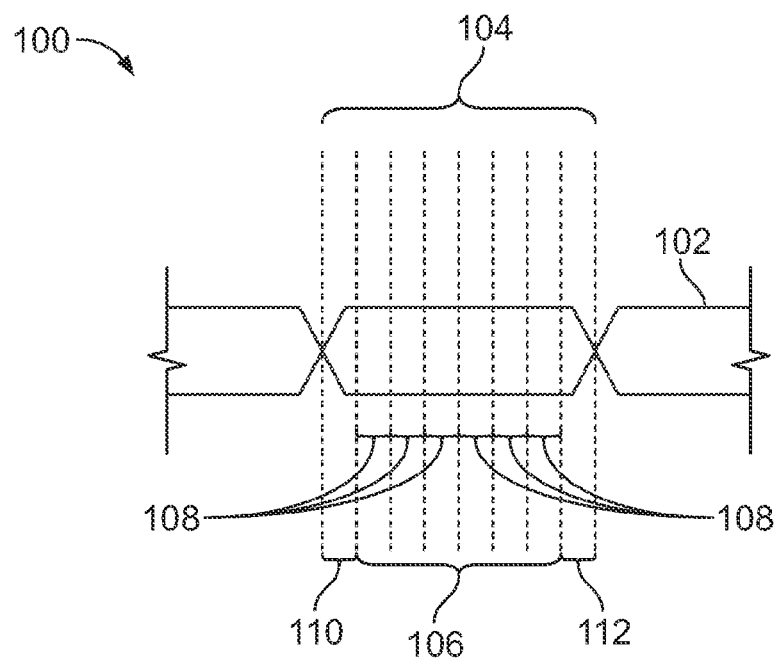
FIG. 5 illustrates an eye diagram of an NRZ signal, according to an embodiment of the present disclosure.

FIG. 5 illustrates an eye diagram 100 of an NRZ signal 102, according to an embodiment of the present disclosure. A single unit interval 104 of the NRZ signal 102 may include an interior region 106 split into six regions 108 of equal duration, and outer edge regions 110 and 112. As shown, the single unit interval 104 may be evenly divided into eight total regions of equal duration, such that the region 110 is a first duration the length of which equals that of each of the remaining regions. The eye quality monitor 18 described above may output the eye quality output 22 based on analysis of transitions within the three regions 108, 110, and 112. For example, when a transition occurs in the regions 108, the eye quality monitor 18 may output a charge signal in a first direction. Conversely, when a transition occurs in the region 110 or 112, the eye quality monitor 18 may output a charge signal in a second direction that is opposite from the first direction.

Figure 6:
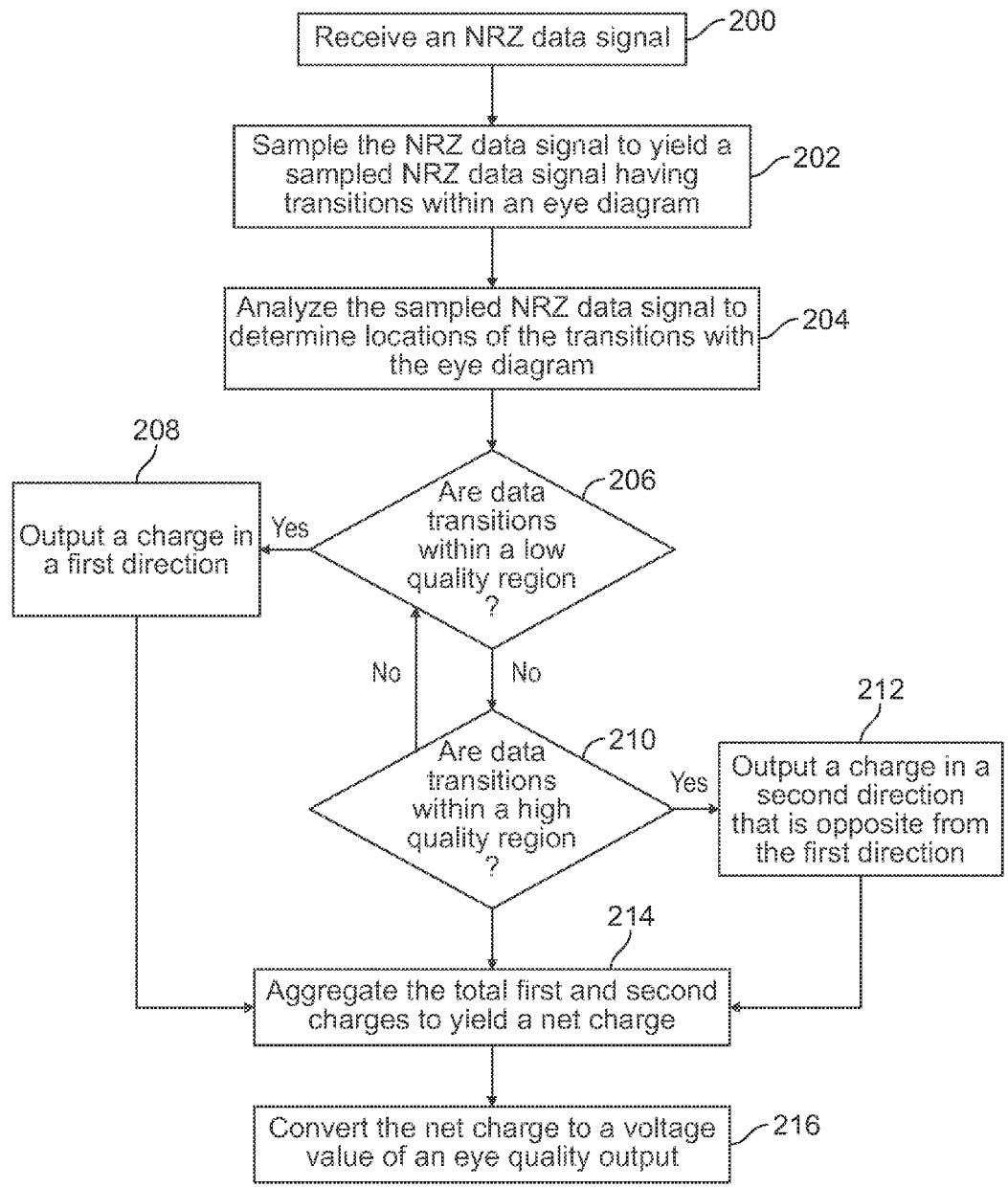
FIG. 6 illustrates a method of monitoring a quality of an eye diagram, according to an embodiment of the present disclosure.

FIG. 6 illustrates a method of monitoring a quality of an eye diagram or pattern, according to an embodiment of the present disclosure. At 200, a data signal, such as an NRZ data signal, is received. At 202, the NRZ data signal is sampled to yield a sampled NRZ data signal having transitions within the eye diagram or pattern. Then, at 204, the sampled NRZ data signal is analyzed to determine locations of transitions between logic states in the eye diagram or pattern. For example, after the sampled NRZ data signal is locked, such as to a clock signal, the NRZ data signal is sampled to determine locations of transitions with the eye diagram.

At 206, it is determined if the transitions are within a low quality region (that is, one or more regions in which transitions of a low quality eye pattern occur), such as within a middle region of a unit interval of the eye diagram. If the data transition(s) is within the low quality region, a charge in a first direction is output at 208.

If, however, the data transition(s) are not within a low quality region, the process continues from 206 to 210, in which it is determined if the data transition(s) is within a high quality region (that is, one or more regions in which transitions of a high quality eye pattern occur), such as within end regions of the unit interval of the eye diagram. If not, the process returns to 206. If, however, the data transition(s) is within the high quality region, the process continues to 212, in which a charge in a second direction is output. The second direction is opposite from the first direction. As noted, the charges in the first direction may be weighted higher than the charges in the second direction. For example, the charges in the first direction may be weighted 2 or more times that of the charges in the second direction, thereby allowing for quicker and easier detection of a closing eye pattern.

At 214, the total first and second charges are aggregated or averaged to yield a net charge. Then, at 216, the net charge may be converted to a voltage value of an eye quality output.

As described above, embodiments of the present disclosure provide systems and methods for determining the quality of an eye diagram of an NRZ signal, for example. Embodiments of the present disclosure provide simplified systems and methods for determining eye quality that use a relatively low amount of power, such as 1 mA or less.

Embodiments of the present disclosure provide systems and methods that receive high speed NRZ data signals from phase detectors. An eye quality monitor in communication with the phase detector may include a charge pump, which may be weighted (for example, the magnitude of charge pumps in one direction may be greater than the magnitude of charge pumps in an opposite direction) in order to provide a weighted integration of the relative frequency of sampled clock transitions.

Embodiments of the present disclosure may be used with various data transmission systems. For example, embodiments of the present disclosure may be used with various telecommunication systems that transmit and receive NRZ data.

As used herein, the term "computer" or "module" may include any processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of the term "computer" or "module."

The computer or processor executes a set of instructions that are stored in one or more storage elements, in order to process data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the subject matter described herein. The set of instructions may be in the form of a software program. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to user commands, or in response to results of previous processing, or in response to a request made by another processing machine.

The block diagrams of embodiments herein may illustrate one or more modules. It is to be understood that the modules represent circuit modules that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hardwired to perform the functions described herein. Optionally, the hardware may include electronic circuits that include and/or are connected to one or more logic-based devices, such as microprocessors, processors, controllers, or the like. Optionally, the modules may represent processing circuitry such as one or more field programmable gate array (FPGA), application specific integrated circuit (ASIC), or microprocessor. The circuit modules in various embodiments may be configured to execute one or more algorithms to perform functions described herein. The one or more algorithms may include aspects of embodiments disclosed herein, whether or not expressly identified in a flowchart or a method.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

While various spatial terms, such as upper, bottom, lower, mid, lateral, horizontal, vertical, and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the disclosure without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112(f), unless and until such claim limitations expressly use the phrase "means for" followed by a statement of function void of further structure.

What is claimed is:

1. An eye quality monitoring system, comprising:
an eye quality monitor that includes a charge pump that is configured to output (a) a first charge in a first direction upon detection of a first transition of a sampled non-return-to-zero (NRZ) data signal in a first region of a unit interval of an eye pattern, and (b) a second charge in a second direction upon detection of a second transition of the sampled NRZ data signal in a second region of the unit interval of the eye pattern, wherein the first direction is opposite from the second direction, and wherein the eye quality monitor is configured to form an eye quality output that relates to a quality of the eye pattern based on the first and second charges; and
an averaging circuit operatively connected to the charge pump, wherein the averaging circuit is configured to receive the first and second charges from the charge pump and aggregate or average the first and second charges to form the eye quality output.

2. The eye quality monitoring system of claim 1, wherein the averaging circuit comprises an integrating capacitor that is configured to receive the first and second charges over a time period and aggregate or average the first and second charges to form a total net charge.

3. The eye quality monitoring system of claim 1, wherein the averaging circuit comprises one or more resistors configured to convert the first and second charges to one or more voltages indicative of the eye quality output.

4. The eye quality monitoring system of claim 1, further comprising:
a receiver configured to receive an NRZ data signal; and
a phase detector configured to convert the NRZ data signal into the sampled NRZ data signal.

5. The eye quality monitoring system of claim 1, further comprising an eye diagram module configured to form the eye pattern based on the sampled NRZ signal.

6. The eye quality monitoring system of claim 1, wherein the first region is within one of a middle region or leading and trailing end regions of the unit interval, and wherein the second region is within the other of the middle region or the leading and trailing end regions of the unit interval.

7. The eye quality monitoring system of claim 6, wherein the leading end region is a first quarter of the unit interval, the middle region is a second quarter and a third quarter of the unit interval, and the trailing end is a fourth quarter of the unit interval.

8. An eye quality monitoring method, comprising:
detecting a first transition of a sampled non-return-to-zero (NRZ) data signal in a first region of a unit interval of an eye pattern;
outputting a first charge in a first direction from a charge pump upon the detecting of the first transition of the sampled NRZ data signal in the first region;
detecting a second transition of the sampled NRZ data signal in a second region of the unit interval;
outputting a second charge in a second direction upon the detecting of the second transition of the sampled NRZ data signal in the second region, wherein the first direction is opposite from the second direction; and
aggregating or averaging the first and second charges to form an eye quality output that relates to a quality of the eye pattern.

9. The eye quality monitoring method of claim 8, wherein the aggregating or averaging includes forming a total net charge based on the first and second charges.

10. The eye quality monitoring method of claim 8, further comprising converting the first and second charges to one or more voltages indicative of the eye quality output.

11. The eye quality monitoring method of claim 8, further comprising:
receiving an NRZ data signal at a receiver; and
using a phase detector to convert the NRZ data signal into the sampled NRZ data signal.

12. The eye quality monitoring method of claim 8, further comprising forming the eye pattern based on the sampled NRZ signal.

13. The eye quality monitoring method of claim 8, wherein the first region is within one of a middle region or leading and trailing end regions of the unit interval, and wherein the second region is within the other of the middle region or the leading and trailing end regions of the unit interval.

14. The eye quality monitoring method of claim 13, wherein the leading end region is a first quarter of the unit interval, the middle region is a second quarter and a third quarter of the unit interval, and the trailing end is a fourth quarter of the unit interval.

15. An eye quality monitoring system, comprising:
a receiver configured to receive non-return-to-zero (NRZ) data signal; and
a phase detector configured to convert the NRZ data signal into a sampled NRZ data signal;
a charge pump that is configured to output (a) a first charge in a first direction upon detection of a first transition of the sampled NRZ data signal in a first region of a unit interval of an eye pattern, and (b) a second charge in a second direction upon detection of a second transition of the sampled NRZ data signal in a second region of the unit interval of the eye pattern, wherein the first direction is opposite from the second direction, and
an averaging circuit operatively connected to the charge pump, wherein the averaging circuit is configured to receive the first and second charges from the charge pump and aggregate or average the first and second charges to form an eye quality output that relates to a quality of the eye pattern, wherein the averaging circuit comprises (a) an integrating capacitor that is configured to receive the first and second charges over a time period and aggregate or average the first and second charges to form a total net charge, and (b) one or more resistors configured to convert the total net charge to a voltage indicative of the eye quality output.

16. The eye quality monitoring system of claim 15, further comprising an eye diagram module configured to form the eye pattern based on the sampled NRZ signal.

17. The eye quality monitoring system of claim 15, wherein the first region is within one of a middle region or leading and trailing end regions of the unit interval, and wherein the second region is within the other of the middle region or the leading and trailing end regions of the unit interval.

18. The eye quality monitoring system of claim 17, wherein the leading end region is a first quarter of the unit interval, the middle region is a second quarter and a third quarter of the unit interval, and the trailing end is a fourth quarter of the unit interval.

19. An eye quality monitoring system, comprising:
an eye quality monitor that includes a charge pump that is configured to output (a) a first charge in first direction upon detection of a first transition of a sampled nonreturn-to-zero (NRZ) data signal in a first region of a unit interval of an eye pattern, wherein the first region is within one of a middle region or leading and trailing end regions of the unit interval, and (b) a second charge in a second direction upon detection of a second transition of the sampled NRZ data signal in a second region of the unit interval of the eye pattern, wherein the second region is within the other of the middle region or the leading and trailing end regions of the unit interval, wherein the first direction is opposite from the second direction, and wherein the eye quality monitor is configured to form an eye quality output that relates to a quality of the eye pattern based on the first and second charges.

20. An eye quality monitoring method, comprising:

detecting a first transition of a sampled non-return-to-zero (NRZ) data signal in a first region of a unit interval of an eye pattern, wherein the first region is within one of a middle region or leading and trailing end regions of the unit interval;

outputting a first charge in a first direction from a charge pump upon the detecting of the first transition of the sampled NRZ data signal in the first region;

detecting a second transition of the sampled NRZ data signal in a second region of the unit interval, wherein the second region is within the other of the middle region or the leading and trailing end regions of the unit interval;

outputting a second charge in a second direction upon the detecting of the second transition of the sampled NRZ data signal in the second region, wherein the first direction is opposite from the second direction; and forming an eye quality output that relates to a quality of the eye pattern based on the first and second charges.

* * * * *